United States Patent [19]

Anderson

[11] Patent Number: 4,808,552
[45] Date of Patent: Feb. 28, 1989

[54] PROCESS FOR MAKING VERTICALLY-ORIENTED INTERCONNECTIONS FOR VLSI DEVICES

[75] Inventor: Dirk N. Anderson, Plano, Tex.

[73] Assignee: Texas Instruments Incorporated, Dallas, Tex.

[21] Appl. No.: 57,631

[22] Filed: Jun. 2, 1987

Related U.S. Application Data

[63] Continuation of Ser. No. 774,764, Sep. 11, 1985, abandoned.

[51] Int. Cl.[4] .................. H01L 21/285; H01L 21/318
[52] U.S. Cl. ..................................... 437/187; 437/192; 437/201; 437/203; 437/241; 437/978; 437/195; 148/DIG. 20; 148/DIG. 43; 148/DIG. 114
[58] Field of Search ............... 437/187, 189, 203, 175, 437/179, 190, 192, 193, 194, 200, 201; 357/71, 67; 156/653, 657

[56] References Cited

U.S. PATENT DOCUMENTS

| | | | |
|---|---|---|---|
| 3,477,872 | 11/1969 | Amick | 437/187 X |
| 3,615,932 | 10/1971 | Makimoto | 437/161 |
| 3,758,943 | 9/1973 | Shibata | 437/195 X |
| 3,785,862 | 1/1974 | Grill | 437/228 |
| 3,974,517 | 8/1976 | Sanders et al. | 357/71 X |
| 3,982,316 | 9/1976 | Calhoun et al. | 29/577 |
| 4,011,653 | 3/1977 | Kato et al. | 437/56 |
| 4,032,962 | 6/1977 | Balyoz et al. | 357/71 X |
| 4,063,973 | 12/1977 | Kirita et al. | 437/161 |
| 4,171,528 | 10/1979 | Kling | 357/71 X |
| 4,317,274 | 3/1982 | Yasunari | 437/189 X |
| 4,333,100 | 6/1982 | Morcom et al. | 357/71 X |
| 4,343,676 | 8/1982 | Taing | 156/618 |
| 4,378,383 | 3/1983 | Moritz | 427/96 |
| 4,392,298 | 7/1983 | Barker et al. | 29/577 C |
| 4,507,171 | 3/1985 | Bhatia et al. | 156/643 |
| 4,521,794 | 6/1985 | Murase et al. | 357/59 |
| 4,532,702 | 8/1985 | Crigante et al. | 29/578 |
| 4,538,344 | 9/1985 | Okumura et al. | 29/589 |
| 4,549,198 | 10/1985 | Kondo | 357/42 |
| 4,562,640 | 1/1986 | Widmann et al. | 29/591 |

OTHER PUBLICATIONS

Tsao et al, "Low Pressure CVD . . . ", *J. Electrochem. Soc. Solid State Sci. & Tech.*, Nov. 1984, pp. 2702–2708.
Moriya et al, "A Planar Metallization . . . ", *IEEE IEDM* 83, pp. 550–553.
Kircher et al, "Interconnection Method", *IBM TDB*, vol. 13, No. 2, 7/1970, p. 436.

*Primary Examiner*—Brian E. Hearn
*Assistant Examiner*—T. N. Quach
*Attorney, Agent, or Firm*—Theodore D. Lindgren; Rodney M. Anderson; Richard A. Bachand

[57] ABSTRACT

A process is disclosed for making a conductive interconnecting path formed between two conductive areas of an integrated circuit, the conductive areas separated by at least an insulating layer of silicon nitride over a layer of oxide. The interconnecting path is formed by depositing a thick insulator coating, over the conductive and non-conductive areas then forming a vertical-walled trench, with said silicon nitride acting as an etch stop, in the thick insulator between conducting areas, then filling the trench with conductive material using chemical vapor deposition, and finally removing conductive material except for that conductive material deposited in the trench.

3 Claims, 3 Drawing Sheets

PROCESS FOR MAKING VERTICALLY-ORIENTED INTERCONNECTIONS FOR VLSI DEVICES

REATED CASES

This application is a continuation of application Ser. No. 774,764, filed Sept. 11, 1985, abandoned, discloses subject matter also disclosed in my prior copending application Ser. No. 659,610, now U.S. Pat. No. 4,589,196 filed Oct. 11, 1984, and in my copending application Ser. No. 774,675, now U.S. Pat. No. 4,751,198, filed herewith; both of said applications are assigned to Texas Instruments.

BACKGROUND OF THE INVENTION

This invention relates to semiconductor devices, and more particularly to metal interconnections for semiconductor integrated circuits.

In the manufacture of VLSI devices, usually a thin metal coating such as aluminum is deposited and patterned to create interconnections. The shrinking dimensions of VLSI devices such as the 1-Megabit dynamic RAMs, requiring one micron sized geometries or less, creates fundamental problems with forming good low resistance, high-current metal interconnects. That is, when the width of a metal interconnect line is decreased as necessary in submicron geometries, the thickness of the metal must increase to maintain a given current capacity. But increased thickness is detrimental from a process standpoint due to the metal etch leaving filaments, and due to the step coverage problems for any subsequent layers, such as in a multiple-level metallization scheme.

It is the principal object of this invention to provide an improved process for making metal interconnections for semiconductor integrated circuits. Another object is to provide improved semiconductor devices with micron or submicron sized metallization patterns, avoiding high resistance or low current capability, and also avoiding process-related problems such as lack of planarity and unwanted filaments. A further object is to provide improved planarity and lower resistance for metallization patterns of semiconductor devices. Another object is to provide a method of making contacts that allow smaller pitch for the metal pattern (closer spacing between metal lines); thus higher density VLSI devices are possible.

SUMMARY OF THE INVENTION

In accordance with one embodiment of the invention, metal interconnects for high density integrated circuits are formed in vertical-walled trenches in a thick insulator coating. The interconnects are vertically oriented; i.e., the vertical dimension of the conductive path is greater than its width. The trench may be filled with conductive material by a chemical vapour deposition process.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
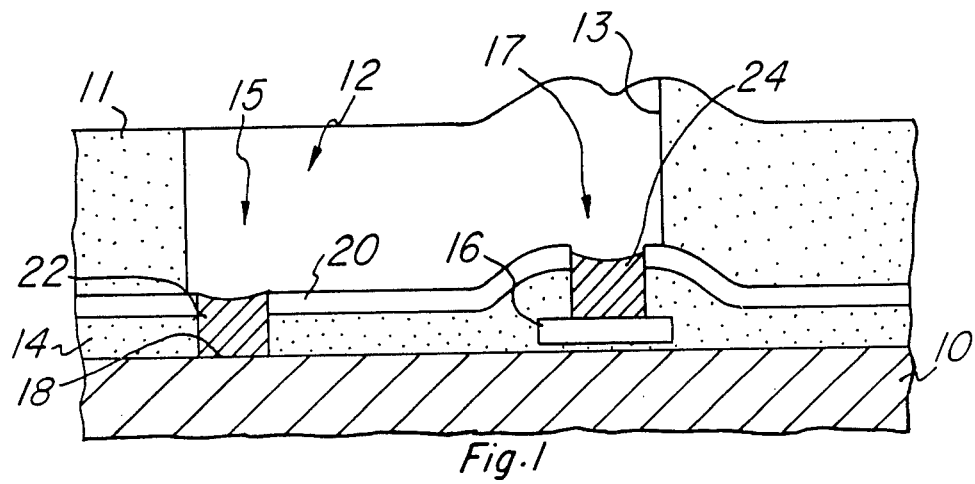
FIGS. 1-3 are greatly enhanced elevation views in section of various stages on the fabrication of vertically oriented interconnections made in accordance with a preferred embodiment of the invention.

Referring to FIGS. 1-4, a method of forming a metal-to-silicon contact is first described. A silicon substrate 10 has a silicon oxide layer 11 deposited on it as seen in FIG. 1, by any of several methods. There may be depositions of and patterning of other layers of polysilicon, refractory metals, or the like included in the process prior to the steps to be described. In any event, a vertical-oriented hole 12 is formed in the oxide layer 11 by an anisotropic etch technique such as RIE. Typically, the hole would be about one micron in width, in an oxide layer of about one micron thickness, or more likely slightly less than one micron. The hole 12 exposes a contact area of the original silicon of the substrate 10, or some intermediate conductor layer.

Figure 2:
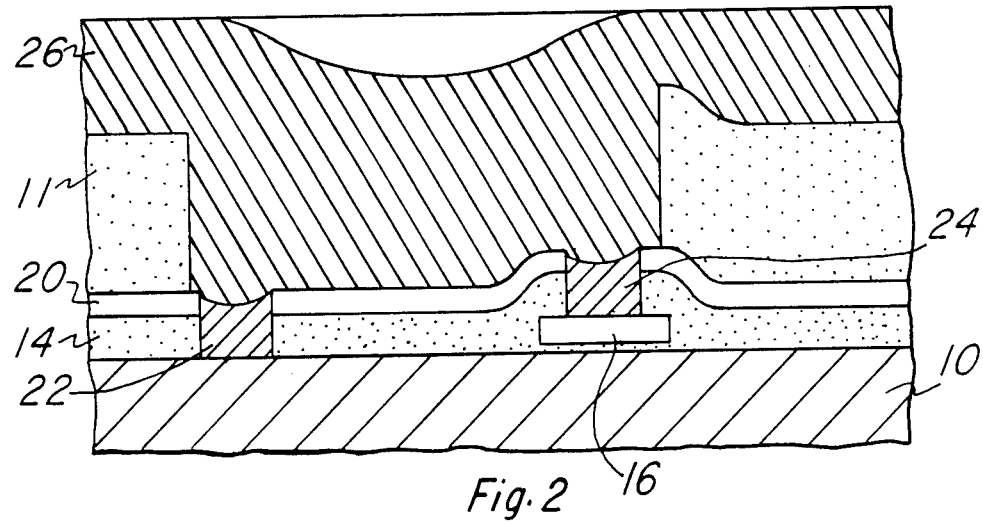
Figure 3:
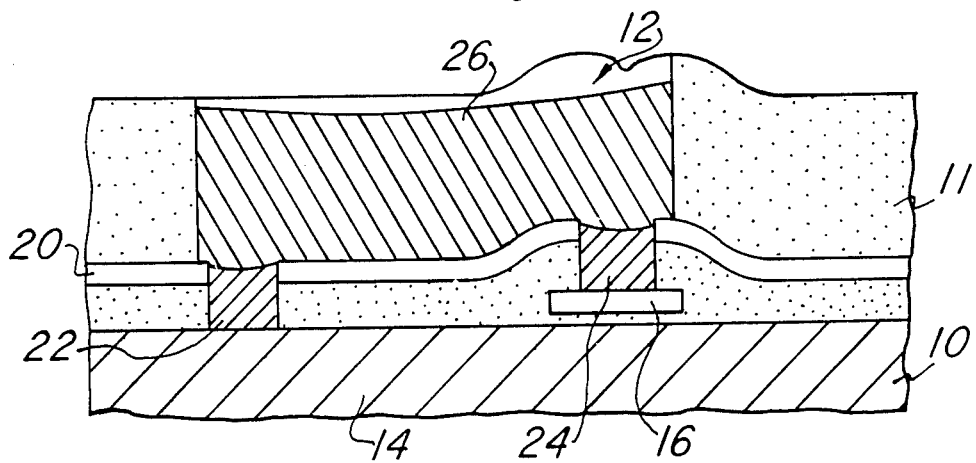

Referring to FIGS. 1-3 given there is shown a contact area 18 on substrate 10 and an intermediate conducting layer 16 and a, silicon dioxide layer 14 over the substrate through which are patterned and etched holes 15 and 17 leading to contact 18 and gate 16. A silicon nitride layer 20 is preferably deposited over oxide layer 14 before etching of holes 15 and 17 to act as an etch stop for a later step. Tungsten plugs 22 and 24 are deposited in holes 15 and 17 by known alternatives.

Next a thick silicon oxide layer 11 is deposited on the silicon nitride 20 and a vertical-walled trench 20 patterned and anisotropically etched in layer 11 in a reverse image of a desired metal pattern down to the silicon nitride 20 and tungsten plugs 22 and 24. Finally, a thick conformed layer of metal 26 is deposited by chemical vapour deposition over the whole face of the semiconductor including trench 12 and, contacting plugs 22 and 24. The metal outside of trench 12 is then etched back leaving the desired interconnect. The depth of trench 12 is much greater than its width. The thickness of the finished interconnect 26 as seen in FIG. 3 has a thickness much greater than one micron while the trench width is less than about 1 micron.

Figure 4:
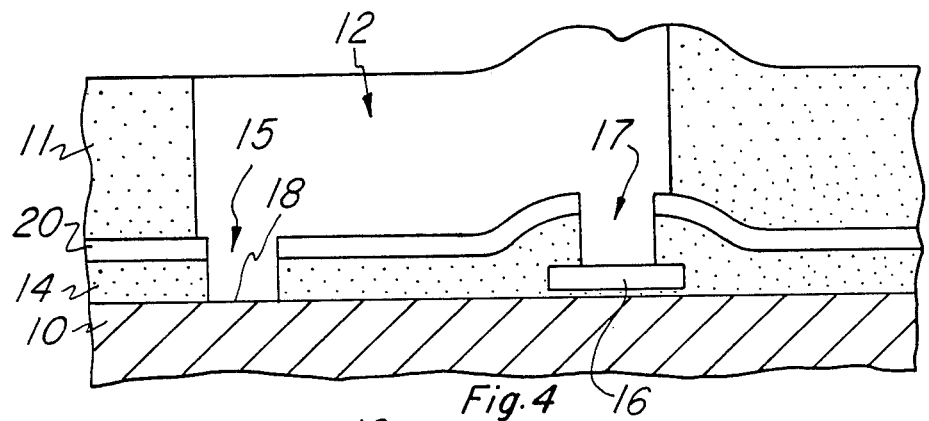
FIGS. 4-6 are elevation views in section of stages in the fabrication of a variant of the interconnection.
Figure 5:
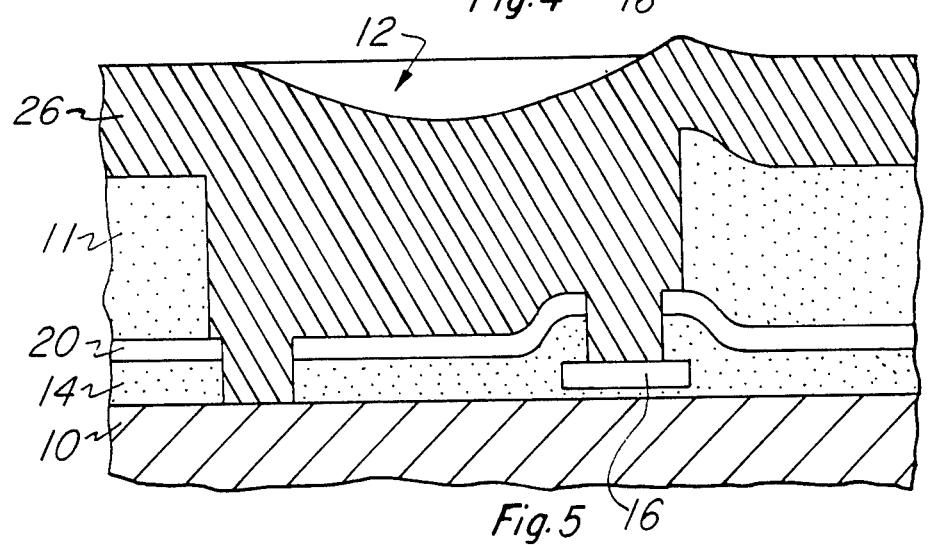
Figure 6:
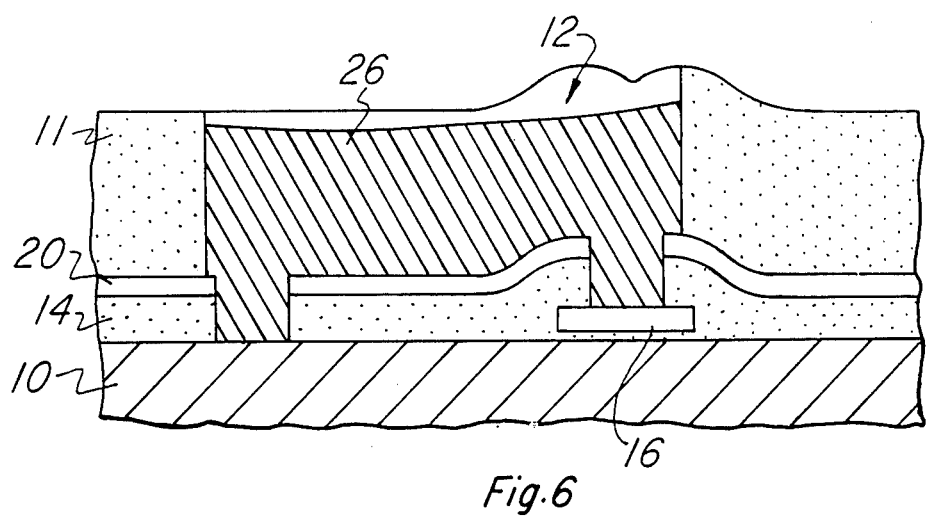

A variant of the device of FIGS. 1-3 and its method of manufacture is illustrated in FIGS. 4-6. Like regions are referred to by the same reference numbers as used for FIGS. 1-3. As shown in FIG. 4, no conducting plugs are used to fill holes 15 and 17. The etch of trench 12 in this case proceeds past silicon nitride layer 20 and silicon dioxide layer 14 until contact areas 18 and 16 are reached. Thus the silicon nitride layer 20 is used to slow the etch in surrounding areas. Otherwise the method is identical to that described for FIGS. 1-3.

In the present method no step to produce planarization is reqired. The CVD metal layer 26 fills the trough and leaves only a slight dip over trench 12 if a thick enough layer is deposited. Etch back of the metal produces a relatively flat top surface.

Figure 7:
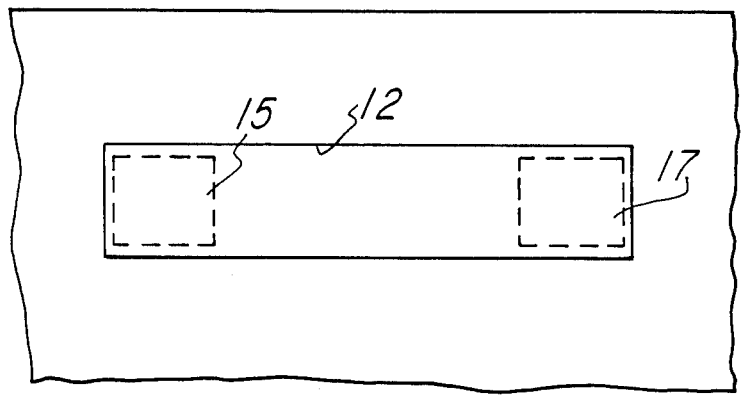
FIG. 7 is a plan view of the interconnection.

As seen in FIG. 7 by making holes 15 and 17 slightly smaller in width than trench 12 slight misalignment of the trench will still result in complete coverage of the contacts.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this descripton. It is therefore contemplated that the appended claims will cover any such modifications or embodiments as fall within the true scope of the invention.

What is claimed:

1. A method of forming an interconnecting path between two conducting areas at a face of a semiconductor body including mutilevel oxide layers and intermediate conductor layers, said method comprising the steps of:

depositing a silicon nitride layer over said multilevel oxide layers;

patterning said silicon nitride layer and said multilevel oxide layers and etching holes through said silicon nitride layer and at least one of said multilevel oxide layers to expose said conductive areas;

applying a thick silicon oxide layer on said face, said thick layer having a thickness greater than the width of said path;

anisotropically etching said thick layer to leave a vertical-walled trench in said thick layer in the form of said path between said conductive areas and to expose said conductive areas at ends of said path, said trench having a depth determined by said silicon nitride layer acting as an etch stop;

conformally depositing by chemical vapor deposition a metal layer on said face to fill said trench;

removing excess metal of said metal layer from said face in areas spaced from the trench to leave sufficient metal of said metal layer in said trench to form said interconnecting path.

2. A method according to claim 1 including forming conductive plugs in said holes through said silicon nitride layer and at least one of said multilevel oxide layers.

3. A method according to claim 2, wherein the conductive plugs in said holes are of tungsten.

* * * * *